United States Patent [19]

Steele

[11] Patent Number: 5,128,559

[45] Date of Patent: Jul. 7, 1992

[54] LOGIC BLOCK FOR PROGRAMMABLE LOGIC DEVICES

[75] Inventor: Randy C. Steele, Southlake, Tex.

[73] Assignee: SGS-Thomson Microelectronics, Inc., Carrollton, Tex.

[21] Appl. No.: 742,028

[22] Filed: Aug. 8, 1991

Related U.S. Application Data

[62] Division of Ser. No. 575,449, Aug. 30, 1990, which is a division of Ser. No. 414,695, Sep. 29, 1989, abandoned.

[51] Int. Cl.[5] .......................................... H03K 19/177
[52] U.S. Cl. ................................ 307/465; 365/189.08
[58] Field of Search ............................... 307/465–469; 340/825.83, 825.87; 364/716; 365/189.08, 229

[56] References Cited

U.S. PATENT DOCUMENTS

| | | | |
|---|---|---|---|
| 4,293,783 | 10/1981 | Patil | 307/465 |
| 4,524,430 | 6/1985 | Page | 307/465 X |
| 4,642,487 | 2/1987 | Carter | 307/465.1 X |
| 4,754,160 | 6/1988 | Ely | 365/229 X |
| 4,975,601 | 12/1990 | Steele | 307/465 |

Primary Examiner—David Hudspeth
Attorney, Agent, or Firm—Kenneth C. Hill; Lisa K. Jorgenson; Richard K. Robinson

[57] ABSTRACT

A standard logic block, or macrocell, is provided for use on programmable logic devices. The macrocell uses RAM to perform logic functions, and further includes circuitry which allows writing of data to the RAM during use. Each logic block can be configured at programming time to be either a user RAM, allowing the user to write data to such memory during use, or configured as performing logic functions. The contents of macrocells configured as providing logic functions cannot be changed except by reprogramming the device.

6 Claims, 2 Drawing Sheets

LOGIC BLOCK FOR PROGRAMMABLE LOGIC DEVICES

This is a Division, of application Ser. No. 07/575,449, filed Aug. 30, 1990 pending, which is a division of Ser. No. 414,695, filed Sep. 29, 1989, now U.S. Pat. No. 4,975,601.

CROSS-REFERENCE TO RELATED APPLICATIONS

The present application contains subject matter related to co-pending U.S. application Ser. No. 414,742, titled CONFIGURATION MEMORY FOR PROGRAMMABLE LOGIC DEVICES, by Randy C. Steele, filed on even date herewith and assigned to the assignee hereof, which is incorporated hereinto by reference.

BACKGROUND OF THE INVENTION

1. Field of the Invention

The present invention relates generally to integrated circuit devices, and more specifically to programmable logic devices which are configurable by a user.

2. Description of the Prior Art

Programmable logic devices are becoming increasingly popular in the electronics industry because of their flexibility. These devices allow a user to configure a standard part to perform a wide variety of standard logic functions. Since a single standard device can be configured many different functions, the total cost of using such a device in a system can be significantly less than the cost of custom designed parts; especially in cases where product volume is not extremely large.

Many programmable logic devices can be programmed only once. This may be done as a final metallization mask step at a silicon foundry. Another design is to provide a device which is programmable by the use of fusible links, with the programming being performed by the user using specialized programming equipment.

Other programmable logic device designs allow the devices to be reprogrammed by the user. These designs typically incorporate non-volatile memory such as EPROMs or EEPROMS to retain the programming, or configuration, information. If it is desired to reprogram the device, the configuration information stored in non-volatile memory on the device can be changed, which changes the functions performed by that device.

Reprogrammable logic devices can also be constructed using RAM, usually SRAM, to retain configuration information. Although such devices retain their configuration only so long as power is applied to the device, they are easily reprogrammed by the user. The use of RAM to perform logic functions has long been known. One approach to using RAM in a programmable logic device is to provide an array of identical logic blocks, also referred to as macrocells, which are interconnected by matrices of programmable switching elements.

Referring to FIG. 1, such a programmable logic device is referred to generally as 10. The device 10 contains an array of macrocells 12-15. Only 4 such macrocells are shown in FIG. 1, but a typical actual device would contain a much larger array.

The macrocells 12-15 are interconnected throurgh programmable switching matrices 16-22. The programmable switching matrices 16-22 each contain a plurality of programmable switches for connecting pairs of signal lines passing therethrough. Their function is similar to the well known cross bar switch. By properly programming the switching matrices, signals can be routed between non-physically adjacent portions of the device 10. For example, an output signal from macrocell 14 can be used as an input to macrocell 13 by routing such signal through programmable switching matrices 21, 22, 20, and 17 in that order.

Inputs are supplied to the device through input buffers 24 connected to input pins 26. The signals from input buffers 24, preferably available in true and complemented versions, are connected to switching matric 16. From this point, they can be routed to different parts of the device 10 as needed. Output buffers 28 are driven by signals routed through switching matrix 21, and drive output pins 30.

In many devices, the input/output pins are programmable as to their function. Thus, any given input/output pin can be programmed to be an input buffer 24 or an output buffer 28. Such technique is preferably used with the present invention, with input buffers 24 being those input/output buffers which have been programmed to be inputs, and output buffers 28 being those which have been programmed to be outputs.

The number of signal lines which connect various portions of the device 10 can be varied as desired. As shown in FIG. 1, each macrocell 12-15 has n inputs and m outputs. All macrocells are preferably identical for ease of design and layout. All programmable switching matrices 16-22 are also preferably identical, with the possible exception of matrices 16 and 21 used to communicate with the input buffers 24 and output buffers 28 respectively. k signal lines are routed between each programmable switching matrix. A typical, actual device 10 design might include, for example, a ten by ten array of macrocells, with programmable switching matrices between macrocells as indicated in FIG. 1. Each macrocell could have n=24 inputs and m=4 outputs, with k=32 signal lines between each programmable switching matrix.

In a device such as described in connection with FIG. 1, it would be desirable to have user RAM on the device. Unlike the RAM used to store configuration information, and thus defining logic functions, the user RAM would be available for use as a memory by the user.

SUMMARY OF THE INVENTION

It is therefore an object of the present invention to provide a programmable logic device having RAM available to the user in addition to logic functions.

It is another object of the present invention to provide such a device wherein logic blocks used for the user RAM and programmed logic have the same design and layout.

It is a further object of the present invention to provide such a device wherein the user can selectively configure each logic block to function as user-writable RAM or programmed logic.

Therefore, according to the present invention, a standard logic block, or macrocell, is provided for use on programmable logic devices. The macrocell uses RAM to perform logic functions, and further includes circuitry which allows writing of data to the RAM during use. Each logic block can be configured at programming time to be either a user RAM, allowing the user to write data to such memory during use, or configured as performing logic functions. The contents of macrocells configured as providing logic functions cannot be changed except by reprogramming the device.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

Figure 1:
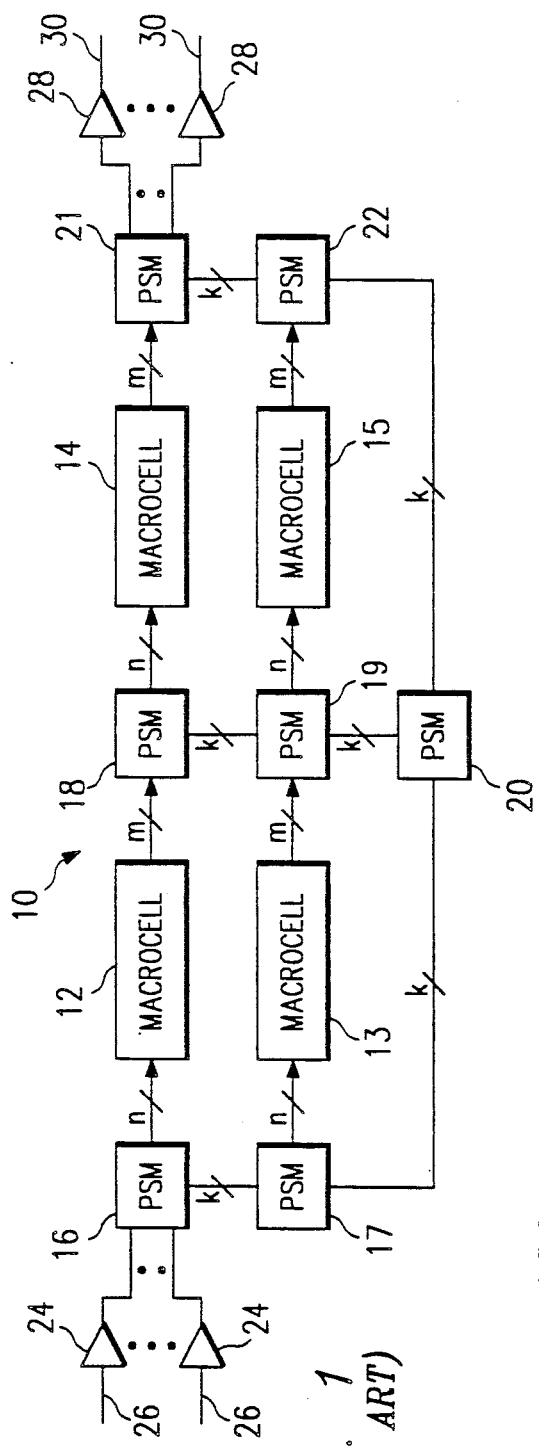
FIG. 1 is a block diagram of a programmable logic device as found in the prior art.
Figure 2:
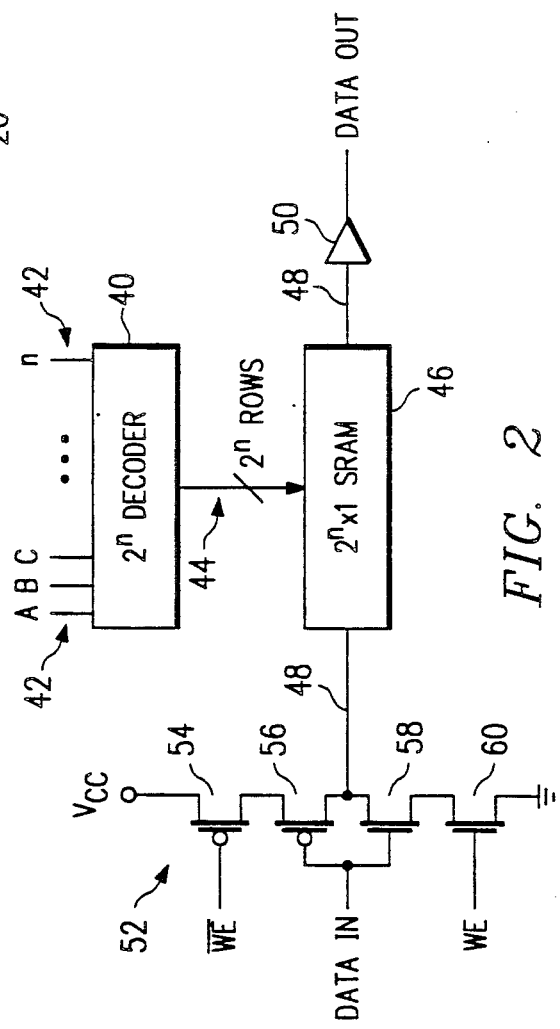
FIG. 2 is a block diagram of a portion of a macrocell according to the present invention.

Referring to FIG. 2, a decoder 40 has n inputs 42. $2^n$ row signal lines 44 are output from the decoder 40 and connected to an SRAM 46. SRAM 46 is preferably a single column SRAM, having $2^n$ positions individually addressed by the row lines 44 of the decoder 40. The value of the selected SRAM 46 entry is connected to a column signal line 48 which provides an input signal to sense amplifier 50. The output of sense amp 50 provides output signal DATA OUT.

A write driver 52 is also connected to the column line 48. Write driver 52 consists of P-channel transistors 54 and 56, and N-channel transistors 58 and 60. Transistors 56 and 58 are connected to the column signal line 48, and are driven by a signal DATA IN. DATA IN contains a value to be written into an SRAM 46 location.

Signals WE (WRITE ENABLE) and WE-bar are used to write data into the SRAM 46. When WE is high WE-bar is low, which turns on transistors 54 and 60. In this event, column line 48 is driven to a value determined by DATA IN. If DATA IN is high, column line 48 is driven to ground, and if DATA IN is low, column line 48 is driven to $V_{cc}$. The value placed on column line 48 is stored into whichever SRAM 46 position is currently addressed by the signals used to drive decoder 40.

Figure 3:
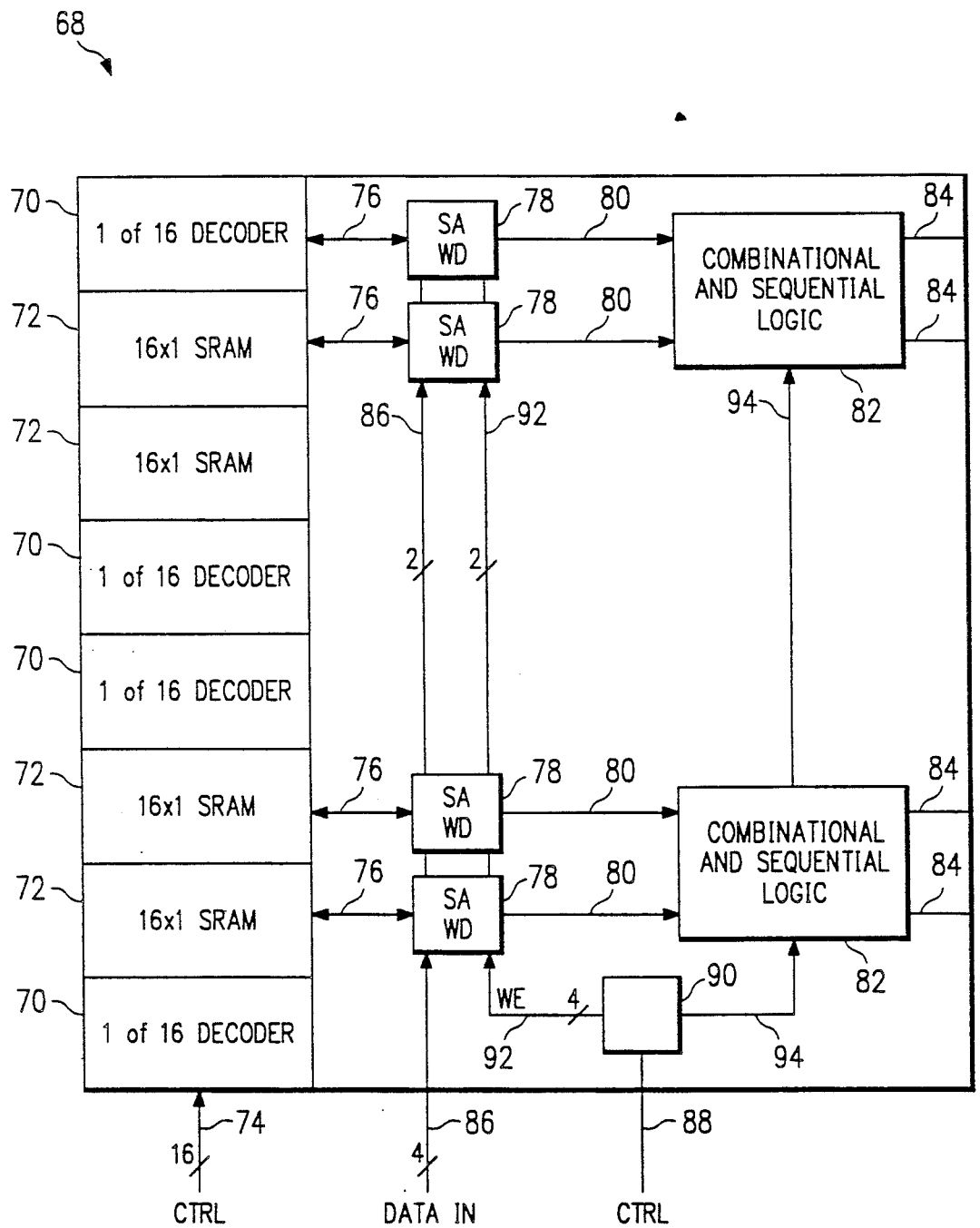
FIG. 3 is a block diagram of a preferred macrocell according to the present invention.

FIG. 3 shows the construction of a preferred macrocell 68 utilizing the circuitry described in connection with FIG. 2. Macrocell 68 contains four decoders 70 and four associated SRAMs 72. Decoders 70 each have four input signal lines and are each capable of addressing 16 bit positions. The corresponding SRAMs 72 therefore each have 16 bit storage positions. Separate control lines are provided to address each decoder, so that a total of 16 decoder control lines 74 are provided to the macrocell 68.

Each SRAM drives a column signal line 76 which is connected to a circuit block 78 containing a sense amplifier and write driver as described in connection with FIG. 2. Sense amplifier output lines 80 are connected to combinational and sequential logic blocks 82, which in turn drive macrocell output lines 84. Logic blocks 82 preferably contain flip-flops and combinational logic to provide various output functions of the values on output lines 80.

Four input data lines 86 are provided to the macrocell 68, with one line being connected to the write driver in each circuit block 78. Control signal lines 88 are provided to the macrocell 68, and serve a dual purpose depending on how the macrocell 68 is configured. Switch 90 is used to route the signal lines 88 to write enable lines 92 or combinational and sequential logic control signal lines 94.

FIG. 3 illustrates a view of the macrocell 68 seen by a user. Not shown are the configuration bits and their associated control lines used to actually configure the macrocell 68. For example, configuration bits are contained within the combinational and sequential logic blocks 82 which drive multiplexers to select which of the available logic functions are to be performed. These configuration bits are set at configuration time, and cannot be changed during normal use. Switch 90 is defined at configuration time in a similar manner. If macrocell 68 is to be used for providing logic functions, control signals on lines 88 are switched to combinational and sequential logic control signal lines 94. If the macrocell 68 is configured to function as user-writable SRAM, four of the signals 88 are switched to write enable signal lines 92. When macrocell 68 is functioning as user-writable SRAM, combinational and sequential logic blocks 82 are configured to simply provide a direct connection between sense amp output lines 80 and macrocell output lines 84. Configuration of the various elements within the macrocell 68 is controlled by the settings of configuration bits within the macrocell 68. As known in the art, these configuration bits are written to using a separate set of address and control lines from those seen by the user during normal operation, and this separate set of signal lines is not shown in FIG. 3.

When macrocell 68 is configured to function as a logic block, DATA IN signal lines 86 are ignored and the write drivers in blocks 78 are disabled. Control signal lines 88 are switched to connect to signal lines 94, and used to control the state of combinational and sequential logic blocks 82. The signals on lines 92 are used to, for example, clock flip-flops, set or reset flip-flops provide output enable signals for signal lines 84, and to perform similar functions. In this configuration, macrocell 68 operates much as do those used in the prior art.

When macrocell 68 is configured to function as user-writable RAM, switch 90 is configurated to route four selected control signals 88 to write enable signal lines 92. Four additional control signals 88 can be used to provide the output enable signals on lines 94. The combinational and sequential logic blocks 82 are configured to provide a direct connection between signal lines 80 and signal lines 84. The write drivers within logic blocks 78 are enabled, and data input signal lines 86 provide data thereto.

When macrocell 68 is used as user-writable RAM, decoder control signal lines 74 are interpreted as address lines. If desired, each of the decoders 70 can be provided with identical address inputs, which configures the macrocell 68 as a 16×4 RAM. By proper selection of the control signals 74, macrocell 68 can also be configured as a 32×2 RAM or a 64×1 RAM. To configure the macrocell 68 as a 64×1 RAM, the four signal lines 84 are tied to a common point in a programmable switching matrix outside the macrocell 68, with only one at a time being enabled by the output enable signals available on signal lines 94. Since the shape of the RAM is determined by the decoder control lines 74, the shape of the RAM is actually configured in the programmable switching matrix which provides the input signal lines to the macrocell 68. Different macrocells 68 can be configured together so as to provide user-writable RAM of any desired depth and width.

As will be appreciated by those skilled in the art, the use of macrocells 68 which can be configured to provide logic functions or to function as user-writable RAM allows increased flexibility in configuring a programmable logic device. If only dedicated RAM is provided as user-writable RAM, it is certain that in many cases the proportions of available user-writable RAM and RAM providing logic functions will not be correct. With a macrocell 68 which can be configured to provide either function, a user can configure the programmable logic device in the most efficient manner to allow full use of all elements on the chip. This allows one or a small number of standard parts to be used for a wide variety of applications.

As described in related co-pending application Ser. No. 414,742, titled CONFIGURATIUON MEMORY FOR PROGRAMMABLE LOGIC DEVICE, a battery backup system can be used to preserve the contents of all SRAM when power is lost to the programmable logic device. Configuration data is retained during a power loss, so that the device need not be reconfigured each time it is powered up. In addition, since the same macrocells 68 are used for user-writable memory and for logic functions, the user-writable memory is also saved by the backup supply.

While the invention has been particularly shown and described with reference to a preferred embodiment, it will be understood by those skilled in the art that various changes in form and detail may be made therein without departing from the spirit and scope of the invention.

What is claimed is:

1. A circuit block for use in programmable logic devices, comprising:
    a decoder;
    a random access memory having a plurality of bits addressed by said decoder, wherein said random access memory provides a plurality of outputs, each corresponding to a column of memory, wherein each column of memory contains 16 bits of storage;
    a read buffer connected to said random access memory for reading data output therefrom, wherein said read buffer provides a separate read buffer for each memory column;
    a write driver connected to said random access memory for inputting data thereto;
    means for configuring the circuit block to function as user-writable memory or to provide a logic function; and
    a plurality of input lines into the circuit block, wherein said input lines provide control signals when the circuit block is configured to provide a logic function, and wherein said input lines provide control and data signals when the circuit block is configured to function as user-writable memory.

2. A circuit block for use in programmable logic devices, comprising:
    a decoder;
    a random access memory having a plurality of bits addressed by said decoder, wherein said random access memory provides a plurality of outputs, each corresponding to a column of memory, wherein said memory columns are capable of being configured to provide a single output;
    a read buffer connected to said random access memory for reading data output therefrom, wherein said read buffer provides a separate read buffer for each memory column;
    a write driver connected to said random access memory for inputting data thereto;
    means for configuring the circuit block to function as user-writable memory or to provide a logic function; and
    a plurality of input lines into the circuit block, wherein said input lines provide control signals when the circuit block is configured to provide a logic function, and wherein said input lines provide control and data signals when the circuit block is configured to function as user-writable memory.

3. A circuit block for use in programmable logic devices, comprising:
    a decoder;
    a random access memory having a plurality of bits addressed by said decoder, wherein said random access memory provides a plurality of outputs, each corresponding to a column of memory, wherein said memory has n columns each having m bits of storage, and wherein said memory columns are capable of being configured as an n output by m bit memory, or as a single output by $(n \times m)$ bit memory;
    a read buffer connected to said random access memory for reading data output therefrom, wherein said read buffer provides a separate read buffer for each memory column;
    a write driver connected to said random access memory for inputting data thereto;
    means for configuring the circuit block to function as user-writable memory or to provide a logic function; and
    a plurality of input lines into the circuit block, wherein said input lines provide control signals when the circuit block is configured to provide a logic function, and wherein said input lines provide control and data signals when the circuit block is configured to function as user-writable memory.

4. The circuit block of claim 3, wherein $m=16$.

5. The circuit block of claim 4, wherein $n=4$.

6. The circuit block of claim 5, wherein said memory columns are further capable of being configured as a 2 output by 32 bit memory.

* * * * *